(12) United States Patent
Hanagata

(10) Patent No.: US 12,255,250 B2
(45) Date of Patent: Mar. 18, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Shoko Hanagata, Komatsu Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 346 days.

(21) Appl. No.: 17/689,800

(22) Filed: Mar. 8, 2022

(65) Prior Publication Data

US 2023/0090885 A1  Mar. 23, 2023

(30) Foreign Application Priority Data

Sep. 17, 2021 (JP) ................. 2021-152087

(51) Int. Cl.
*H01L 29/739* (2006.01)
*H01L 29/861* (2006.01)

(52) U.S. Cl.
CPC ........ *H01L 29/7393* (2013.01); *H01L 29/861* (2013.01)

(58) Field of Classification Search
CPC ............... H01L 29/7393; H01L 29/861; H01L 29/0692; H01L 29/0834; H01L 29/8613; H01L 29/407; H01L 29/7397
See application file for complete search history.

(56) References Cited

U.S. PATENT DOCUMENTS 9,159,721 B2  10/2015  Okawara et al.
9,159,722 B2  10/2015  Ogura et al.
(Continued)

FOREIGN PATENT DOCUMENTS

JP  2014-075582 A  4/2014
JP  5918288 B2  5/2016
(Continued)

OTHER PUBLICATIONS

Office Action of corresponding Japanese Patent Application No. 2021-152087 issued on May 31, 2024, 8 pages.
(Continued)

*Primary Examiner* — Caleb E Henry
(74) *Attorney, Agent, or Firm* — Knobbe, Martens, Olson & Bear, LLP

(57) ABSTRACT

A semiconductor device includes: a first electrode; a first semiconductor layer on the first electrode in a diode region; a second semiconductor layer on the first electrode in an IGBT region; a semiconductor layer on the first and second semiconductor layers, a first upper layer of the semiconductor layer in the diode region including a first region adjacent to the IGBT region and a second region separated from the IGBT region, an impurity concentration being less in the first region than in the second region; a third semiconductor layer on the semiconductor layer; a fourth semiconductor layer of the third semiconductor layer in the IGBT region; a third electrode extending in a direction from the fourth semiconductor layer toward the semiconductor layer; and an insulating film between the second electrode and each of the third semiconductor layer, the semiconductor layer, and the third electrode.

9 Claims, 7 Drawing Sheets

(56) References Cited

U.S. PATENT DOCUMENTS

| | | | |
|---|---|---|---|
| 10,297,593 B2* | 5/2019 | Gejo | H01L 29/8613 |
| 10,763,345 B2 | 9/2020 | Murakawa et al. | |
| 10,777,549 B2 | 9/2020 | Shirakawa | |
| 2007/0158680 A1* | 7/2007 | Ozeki | H01L 29/66333 |
| | | | 257/163 |
| 2012/0267680 A1* | 10/2012 | Oya | H01L 29/0696 |
| | | | 257/E29.201 |
| 2013/0037853 A1* | 2/2013 | Onozawa | H01L 29/41766 |
| | | | 257/E29.198 |
| 2013/0200451 A1* | 8/2013 | Yilmaz | H01L 29/086 |
| | | | 438/270 |
| 2014/0054645 A1* | 2/2014 | Saito | H01L 29/0696 |
| | | | 257/139 |
| 2014/0070270 A1 | 3/2014 | Yoshida et al. | |
| 2014/0197876 A1* | 7/2014 | Laven | H01L 21/2822 |
| | | | 438/135 |
| 2014/0217465 A1 | 8/2014 | Soeno | |
| 2015/0349103 A1* | 12/2015 | Onozawa | H01L 29/0696 |
| | | | 257/144 |
| 2016/0079369 A1 | 3/2016 | Ogura et al. | |
| 2016/0218101 A1 | 7/2016 | Gejo | |
| 2018/0069075 A1 | 3/2018 | Naito | |
| 2018/0108738 A1* | 4/2018 | Naito | H01L 29/404 |
| 2018/0138299 A1* | 5/2018 | Naito | H01L 29/7391 |
| 2018/0286943 A1* | 10/2018 | Naito | H01L 29/4236 |
| 2018/0301550 A1* | 10/2018 | Sakurai | H01L 29/0684 |
| 2018/0337233 A1* | 11/2018 | Naito | H01L 29/7396 |
| 2018/0342605 A1* | 11/2018 | Dainese | H01L 29/0619 |
| 2019/0148532 A1* | 5/2019 | Naito | H01L 29/739 |
| | | | 257/330 |
| 2019/0157264 A1* | 5/2019 | Yoshida | H01L 27/0716 |
| 2019/0157381 A1* | 5/2019 | Naito | H01L 29/063 |
| 2019/0189750 A1* | 6/2019 | Naito | H01L 29/0623 |
| 2019/0206860 A1* | 7/2019 | Kamimura | H01L 29/66348 |
| 2019/0221642 A1* | 7/2019 | Naito | H01L 21/26513 |

FOREIGN PATENT DOCUMENTS

| | | |
|---|---|---|
| JP | 2016-139719 A | 8/2016 |
| JP | 6158058 B2 | 7/2017 |
| JP | 6222702 B2 | 11/2017 |
| JP | 2018-041845 A | 3/2018 |
| JP | 6589817 B2 | 10/2019 |
| JP | 6717432 B2 | 7/2020 |
| WO | WO 2013/030943 A1 | 3/2013 |

OTHER PUBLICATIONS

Office Action of corresponding Japanese Patent Application No. 2021-152087 issued on Oct. 10, 2024 in 4 pages.

* cited by examiner

SEMICONDUCTOR DEVICE

CROSS-REFERENCE TO RELATED APPLICATIONS

This application is based upon and claims the benefit of priority from Japanese Patent Application No. 2021-152087, filed on Sep. 17, 2021; the entire contents of which are incorporated herein by reference.

FIELD

Embodiments relate to a semiconductor device.

BACKGROUND

A RC-IGBT (Reverse Conducting-IGBT) in which a diode region and an IGBT (Insulated Gate Bipolar Transistor) region are set is conventionally known. In an RC-IGBT, a return current from the emitter side toward the collector side of the IGBT region can be caused to flow in the diode region.

DETAILED DESCRIPTION

Figure 1:
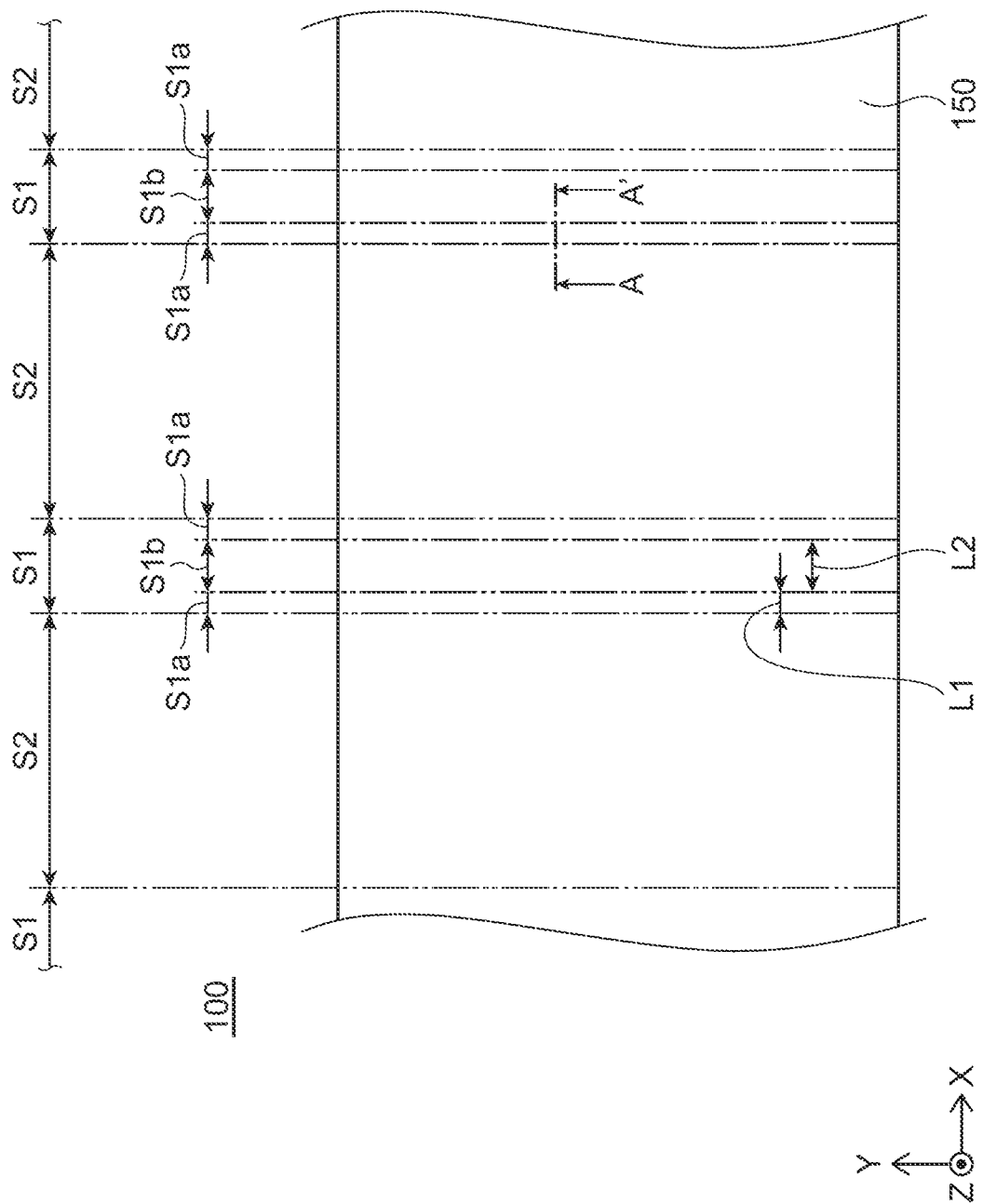
FIG. 1 is a top view showing a semiconductor device according to a first embodiment.

In general, according to one embodiment, semiconductor device in which a diode region and an IGBT region are set, the device includes: a first electrode located from the diode region to the IGBT region; a first semiconductor layer located on the first electrode in the diode region, the first semiconductor layer being of a first conductivity type; second semiconductor layer located on the first electrode in the IGBT region, the second semiconductor layer being of a second conductivity type; semiconductor layer located on the first and second semiconductor layers, the semiconductor layer being of the first conductivity type, an impurity concentration in a first region of an upper layer portion of the semiconductor layer being less than an impurity concentration in a second region of the upper layer portion, the first region being positioned in the diode region and being adjacent to the IGBT region, the second region being positioned in the diode region and separated from the IGBT region; a third semiconductor layer located on the semiconductor layer in the diode region and the IGBT region, the third semiconductor layer being of the second conductivity type; fourth semiconductor layer located in an upper layer portion of the third semiconductor layer in the IGBT region, the fourth semiconductor layer being of the first conductivity type; a second electrode extending in a direction from the fourth semiconductor layer toward the semiconductor layer in the IGBT region, the second electrode being next to the fourth semiconductor layer, the third semiconductor layer, and the semiconductor layer; a third electrode positioned on the third semiconductor layer in the diode region and positioned on the fourth semiconductor layer in the IGBT region; and an insulating film located between the second electrode and the fourth semiconductor layer, between the second electrode and the third semiconductor layer, between the second electrode and the semiconductor layer, and between the second electrode and the third electrode.

In general, according to one embodiment, a semiconductor device in which a diode region and an IGBT region are set, the device includes: a first electrode located from the diode region to the IGBT region; a first semiconductor layer located on the first electrode in the diode region, the first semiconductor layer being of a first conductivity type; a second semiconductor layer located on the first electrode in the IGBT region, the second semiconductor layer being of a second conductivity type; a semiconductor layer located on the first and second semiconductor layers, the semiconductor layer being of the first conductivity type; a third semiconductor layer located on the semiconductor layer in the diode region and the IGBT region, the third semiconductor layer being of the second conductivity type, an impurity concentration of a first region of the third semiconductor layer being greater than an impurity concentration of a second region of the third semiconductor layer, the first region being positioned in the diode region and being adjacent to the IGBT region, the second region being positioned in the diode region and separated from the IGBT region; a fourth semiconductor layer located in an upper layer portion of the third semiconductor layer in the IGBT region, the fourth semiconductor layer being of the first conductivity type; a second electrode extending in a direction from the fourth semiconductor layer toward the semiconductor layer in the IGBT region, the second electrode being next to the fourth semiconductor layer, the third semiconductor layer, and the semiconductor layer; a third electrode positioned on the third semiconductor layer in the diode region and positioned on the fourth semiconductor layer in the IGBT region; and an insulating film located between the second electrode and the fourth semiconductor layer, between the second electrode and the third semiconductor layer, between the second electrode and the semiconductor layer, and between the second electrode and the third electrode.

In general, according to one embodiment, a semiconductor device in which a diode region and an IGBT region are set, the device includes: a first electrode located from the diode region to the IGBT region; a first semiconductor layer located on the first electrode in the diode region, the first semiconductor layer being of a first conductivity type; a second semiconductor layer located on the first electrode in the IGBT region, the second semiconductor layer being of a second conductivity type; a semiconductor layer located on the first and second semiconductor layers, the semiconductor layer being of the first conductivity type; a third semiconductor layer located on the semiconductor layer in the diode region and the IGBT region, the third semiconductor layer being of the second conductivity type; a fourth semiconductor layer located in an upper layer portion of the third semiconductor layer in the IGBT region, the fourth semiconductor layer being of the first conductivity type; a fifth semiconductor layer located in the upper layer portion of the third semiconductor layer in the diode region, the fifth semiconductor layer being of the second conductivity type, the fifth semiconductor layer including a higher impurity concentration than the third semiconductor layer, a surface area per unit area of the fifth semiconductor layer in a first region being greater than a surface area per unit area of the fifth semiconductor layer in a second region, the first region being positioned in the diode region when viewed from above and being adjacent to the IGBT region, the second region being positioned in the diode region when viewed from above and being separated from the IGBT region; a second electrode extending in a direction from the fourth semiconductor layer toward the semiconductor layer in the IGBT region, the second electrode being next to the fourth semiconductor layer, the third semiconductor layer, and the semiconductor layer; a third electrode positioned on the third semiconductor layer in the diode region and positioned on the fourth semiconductor layer in the IGBT region; and an insulating film located between the second electrode and the fourth semiconductor layer, between the second electrode and the third semiconductor layer, between the second electrode and the semiconductor layer, and between the second electrode and the third electrode.

Exemplary embodiments will now be described with reference to the drawings. The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions. Furthermore, in the specification of the application and the drawings, components similar to those described in regard to a drawing thereinabove are marked with like reference numerals; and a detailed description is omitted as appropriate.

For easier understanding of the following description, the arrangements and configurations of the portions are described using an XYZ orthogonal coordinate system. An X-axis, a Y-axis, and a Z-axis are orthogonal to each other. The direction in which the X-axis extends is taken as an "X-direction"; the direction in which the Y-axis extends is taken as a "Y-direction"; and the direction in which the Z-axis extends is taken as a "Z-direction". Although the direction of the arrow in the Z-direction is taken as up and the opposite direction is taken as down for easier understanding of the description, these directions are independent of the direction of gravity.

Hereinbelow, the notations of + and − indicate relative levels of the impurity concentrations of each conductivity type. Specifically, a notation marked with "+" indicates a higher impurity concentration than a notation not marked with either "+" or "−". A notation marked with "−" indicates a lower impurity concentration than a notation not marked with either "+" or "−". Here, when both an impurity that forms donors and an impurity that forms acceptors are included in each region, the "impurity concentration" means the net impurity concentration after the impurities cancel.

First Embodiment

First, a first embodiment will be described.

FIG. 1 is a top view showing a semiconductor device according to the embodiment.

Figure 2:
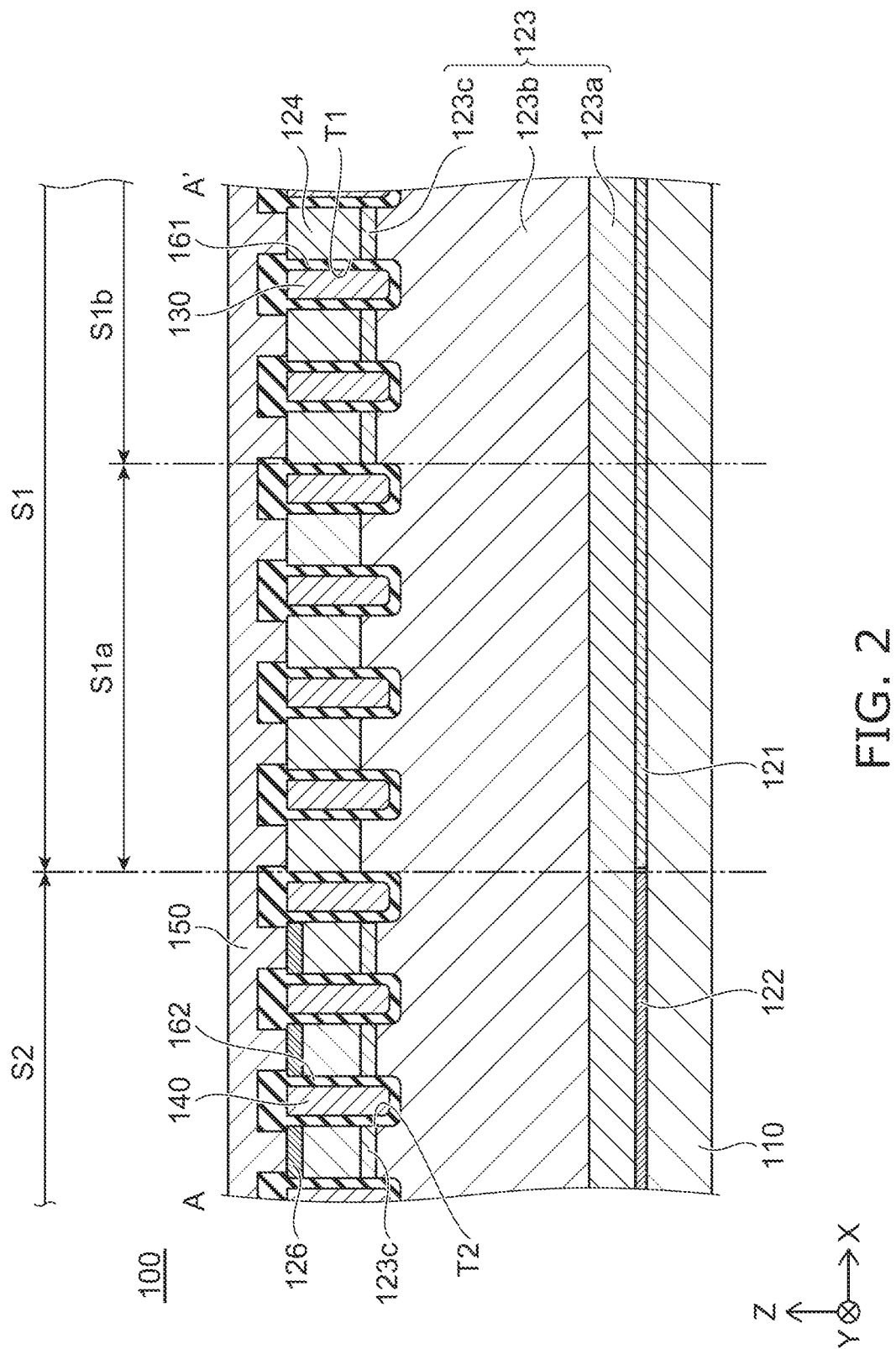
FIG. 2 is a cross-sectional view along line A-A' of FIG. 1.

FIG. 2 is a cross-sectional view along line A-A' of FIG. 1.

The semiconductor device 100 according to the embodiment is an RC-IGBT. As shown in FIG. 1, multiple diode regions S1 and multiple IGBT regions S2 are set in the semiconductor device 100. The multiple diode regions S1 and the multiple IGBT regions S2 are alternately arranged in the X-direction.

According to the embodiment as shown in FIG. 2, the semiconductor device 100 includes a lower electrode 110, an $n^+$-type cathode layer 121, a $p^+$-type collector layer 122, an n-type semiconductor part (semiconductor layer, semiconductor region)123, a p-type semiconductor layer 124, an $n^+$-type emitter layer 126, multiple internal electrodes 130, multiple gate electrodes 140, an upper electrode 150, multiple insulating films 161, and multiple insulating films 162. The components of the semiconductor device 100 will now be elaborated The side on which the lower electrode 110 is disposed is defined as "lower side", and the side on which the upper electrode 150 is disposed is defined as "upper side".

The lower electrode 110 is made of a conductive material such as a metal material, etc. The lower electrode 110 is located in substantially the entire region of the lower surface of the semiconductor device 100. In other words, the lower electrode 110 is located from the diode region S1 to the IGBT region S2. The lower electrode 110 functions as a cathode electrode in the diode region S1, and functions as a collector electrode in the IGBT region S2. The upper surface and the lower surface of the lower electrode 110 are substantially parallel to the XY plane.

According to the embodiment, the $n^+$-type cathode layer 121 is located on a portion of the lower electrode 110 positioned in the diode region S1.

According to the embodiment, the $p^+$-type collector layer 122 is located on a portion of the lower electrode 110 positioned in the IGBT region S2. The $p^+$-type collector layer 122 is next to the $n^+$-type cathode layer 121 in the X-direction. However, a portion of the $n^+$-type cathode layer may be positioned in the IGBT region; and a portion of the $p^+$-type collector layer may be positioned in the diode region.

The n-type semiconductor part 123 is located from the diode region S1 to the IGBT region S2. According to the embodiment, the semiconductor part 123 is located on the $n^+$-type cathode layer 121 in the diode region S1, and located on the $p^+$-type collector layer 122 in the IGBT region.

The semiconductor part 123 includes an $n^+$-type buffer layer 123a, an $n^-$-type drift layer 123b, and an n-type barrier layer 123c.

The $n^+$-type buffer layer 123a is located from the diode region S1 to the IGBT region S2. The $n^+$-type buffer layer 123a is located on the $n^+$-type cathode layer 121 in the diode region S1, and located on the $p^+$-type collector layer 122 in the IGBT region S2. The impurity concentration of the $n^+$-type buffer layer 123a is less than the impurity concentration of the $n^+$-type cathode layer 121. However, an n-type buffer layer may not be included in the semiconductor device.

The n⁻-type drift layer 123b is located on the n⁺-type buffer layer 123a in the diode region S1 and the IGBT region S2. The impurity concentration of the n⁻-type drift layer 123b is less than the impurity concentration of the n⁺-type buffer layer 123a.

As shown in FIG. 1, the diode region S1 includes a first region S1a that is adjacent to the IGBT region S2, and a second region S1b that is separated from the IGBT region S2. One second region S1b is positioned between two first regions S1a in the diode region S1 that is positioned between two IGBT regions S2. Accordingly, in the diode region S1 positioned between the two IGBT regions S2, the first regions S1a are the regions of the diode region S1 at the vicinity of the IGBT regions S2; and the second region S1b is the region at the center of the diode region S1.

As shown in FIG. 2, the n-type barrier layer 123c is located at the upper layer portion of the n⁻-type drift layer 123b in the second region S1b and the IGBT region S2. According to the embodiment, the n-type barrier layer 123c is not located in the first region S1a of the diode region S1. The impurity concentration of the n-type barrier layer 123c is greater than the impurity concentration of the n⁻-type drift layer 123b. Also, the impurity concentration of the n-type barrier layer 123c is less than the impurity concentrations of the n⁺-type cathode layer 121 and the n⁺-type buffer layer 123a. However, the magnitude relationships between the impurity concentration of the n-type barrier layer and the impurity concentrations of the n⁺-type cathode layer and the n⁺-type buffer layer are not limited to those described above.

Thus, according to the embodiment, because the n-type barrier layer 123c is located in the second region S1b, the impurity concentration of the portion of the upper layer portion of the semiconductor part 123 positioned in the first region S1a is less than the impurity concentration of the portion of the upper layer portion positioned in the second region S1b. In other words, an impurity concentration in a first upper region of the semiconductor part 123 in the first region S1a is less than an impurity concentration in a second upper region of the semiconductor part 123 in the second region S1b. The first upper region and the second upper region are in direct contact with the p-type semiconductor layer 124. The first upper region may be the n-type barrier layer 123c. The second upper region of the semiconductor part 123 in the second region S1b may be an upper region of the n⁻-type drift layer 123b in the second region S1b. Although not particularly limited, the difference between the impurity concentration of the n-type barrier layer 123c and the impurity concentration of the n⁻-type drift layer 123b is, for example, not less than $3 \times 10^{13}$ cm⁻³ and not more than $1 \times 10^{14}$ cm⁻³.

However, the method of setting the impurity concentration of the portion of the upper layer portion of the n-type semiconductor part positioned in the first region to be less than the impurity concentration of the portion of the upper layer portion positioned in the second region is not limited to that described above. For example, the upper layer portion of the n-type semiconductor part may be configured so that the impurity concentration increases gradually or in stages from the boundary between the diode region and the IGBT region toward the center of the diode region.

According to the embodiment as shown in FIG. 1, a width L1 in the X-direction of the first region S1a is less than a width L2 in the X-direction of the second region S1b. However, the magnitude relationship between the width of the first region and the width of the second region is not limited to that described above. For example, the width of the first region and the width of the second region may be substantially the same, or the width of the first region may be greater than the width of the second region.

As shown in FIG. 2, the p-type semiconductor layer 124 is located in the diode region S1 and the IGBT region S2. The p-type semiconductor layer 124 is located on the n⁻-type drift layer 123b and contacts the n⁻-type drift layer 123b. Also, in the second region S1b and the IGBT region S2, the p-type semiconductor layer 124 is located on the n-type barrier layer 123c and contacts the n-type barrier layer 123c.

The n⁺-type emitter layer 126 is located at the upper layer portion of the p-type semiconductor layer 124 in the IGBT region S2, but is not located in the diode region S1.

The n⁺-type cathode layer 121, the p⁺-type collector layer 122, the n-type semiconductor part 123, the p-type semiconductor layer 124, and the n⁺-type emitter layer 126 include, for example, a semiconductor material such as silicon or the like and impurities corresponding to each layer.

In the diode region S1, a p⁺-type contact layer that includes a higher impurity concentration than the p-type semiconductor layer 124 and has an ohmic contact with the upper electrode 150 that is described below may be partially provided at the upper layer portion of the p-type semiconductor layer 124.

Multiple trenches T1 are provided in the diode region S1. The multiple trenches T1 are arranged in the X-direction. The trenches T1 extend from the upper surface of the p-type semiconductor layer 124 to the n⁻-type drift layer 123b. The trenches T1 extend in the Y-direction. The lower end of each trench T1 is positioned lower than the lower surface of the n-type barrier layer 123c and higher than the lower surface of the n⁻-type drift layer 123b.

The internal electrode 130 is located in each trench T1. The internal electrodes 130 are made of a conductive material such as a metal material, polysilicon, etc. The internal electrodes 130 extend from the upper surface of the p-type semiconductor layer 124 to the n⁻-type drift layer 123b. The lower end of each internal electrode 130 is positioned lower than the lower surface of the n-type barrier layer 123c and higher than the lower surface of the n⁻-type drift layer 123b. Each internal electrode 130 in the first region S1a is next to the p-type semiconductor layer 124 and the n⁻-type drift layer 123b in the X-direction. Each internal electrode 130 in the second region S1b is next to the p-type semiconductor layer 124, the n-type barrier layer 123c, and the n⁻-type drift layer 123b in the X-direction.

Multiple trenches T2 are provided in the IGBT region S2. The multiple trenches T2 are arranged in the X-direction. The trenches T2 extend from the upper surface of the n⁺-type emitter layer 126 to the n⁻-type drift layer 123b. The lower end of each trench T2 is positioned lower than the upper surface of the n⁻-type drift layer 123b and higher than the lower surface of the n⁻-type drift layer 123b.

The gate electrode 140 is located in each trench T2. The gate electrodes 140 are made of a conductive material such as a metal material, polysilicon, etc. The gate electrodes 140 extend from the upper surface of the n⁺-type emitter layer 126 to the n⁻-type drift layer 123b. The lower end of each gate electrode 140 is positioned higher than the lower surface of the n⁻-type drift layer 123b. Each gate electrode 140 is next to the n⁺-type emitter layer 126, the p-type semiconductor layer 124, the n-type barrier layer 123c, and the n⁻-type drift layer 123b in the X-direction.

The upper electrode 150 is made of a conductive material such as a metal material, etc. The upper electrode 150 is located from the diode region S1 to the IGBT region S2. The upper electrode 150 is located on the p-type semiconductor layer 124 in the diode region S1. Also, the upper electrode 150 is located on the n$^+$-type emitter layer 126 in the IGBT region S2. The upper electrode 150 functions as an anode electrode in the diode region S1, and functions as an emitter electrode in the IGBT region S2. The upper electrode 150 is electrically connected to each internal electrode 130. In other words, the potential of the upper electrode 150 and the potential of the internal electrode 130 are substantially equal.

In the diode region S1, the insulating films 161 are located between the upper electrode 150 and the internal electrodes 130, between the p-type semiconductor layer 124 and the internal electrodes 130, and between the n-type semiconductor part 123 and the internal electrodes 130.

In the IGBT region S2, the insulating films 162 are located between the upper electrode 150 and the gate electrodes 140, between the n$^+$-type emitter layer 126 and the gate electrodes 140, between the p-type semiconductor layer 124 and the gate electrodes 140, and between the n-type semiconductor part 123 and the gate electrodes 140.

The insulating films 161 and 162 are made of insulating materials such as silicon oxide, silicon nitride, etc.

Effects of the semiconductor device 100 according to the embodiment will now be described.

Figure 3A:
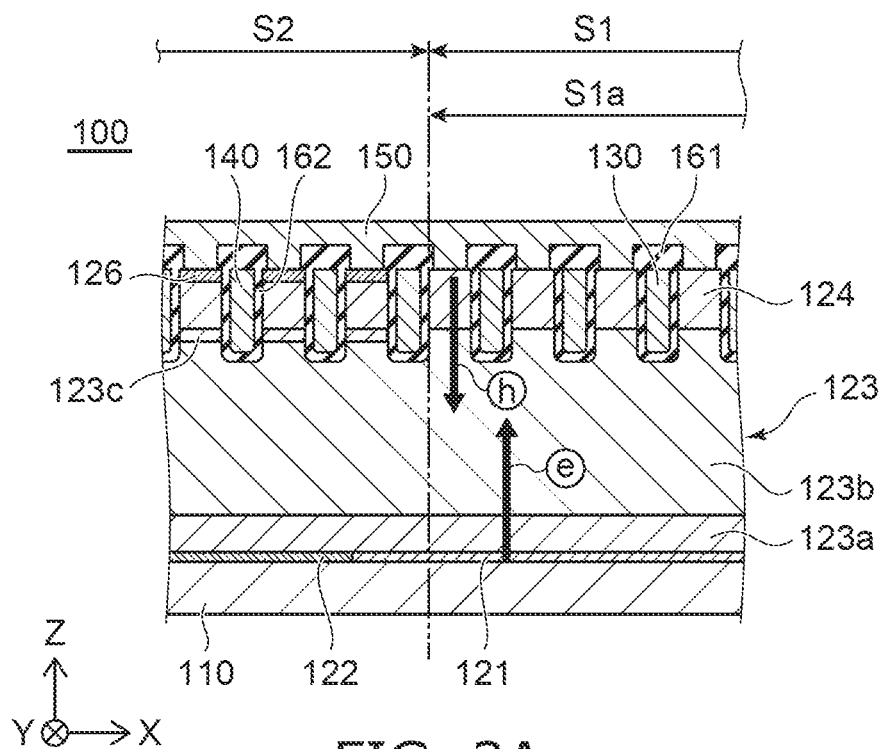
FIG. 3A is a schematic view showing a movement direction of carriers in the semiconductor device according to the first embodiment.
Figure 3B:
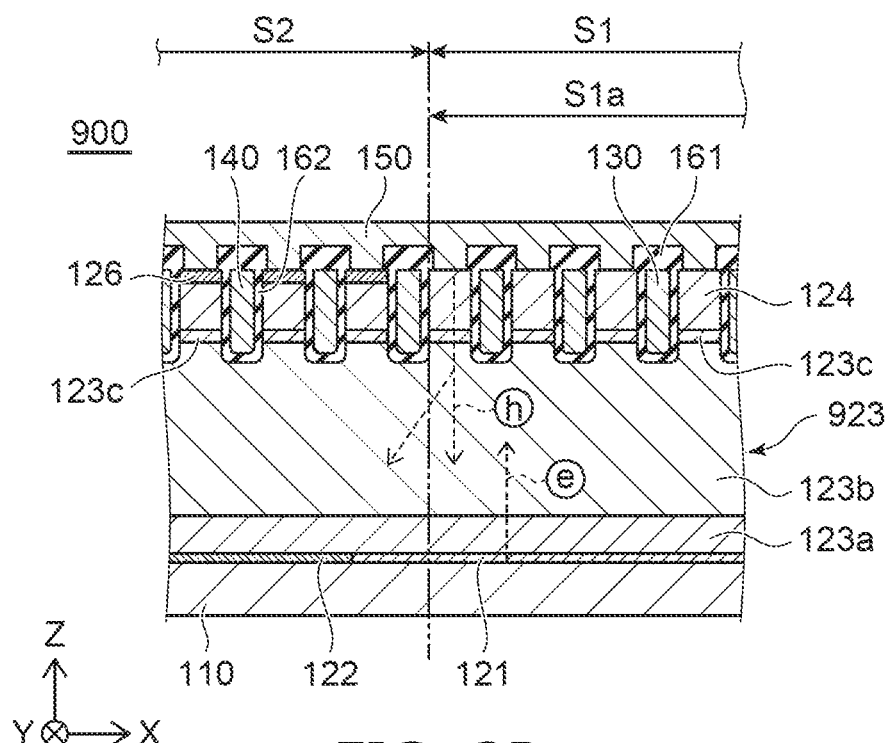
FIG. 3B is a schematic view showing a movement direction of carriers in a semiconductor device according to a reference example.

FIG. 3A is a schematic view showing the movement direction of carriers in the semiconductor device according to the embodiment; and FIG. 3B is a schematic view showing the movement direction of carriers in a semiconductor device according to a reference example.

Figure 4A:
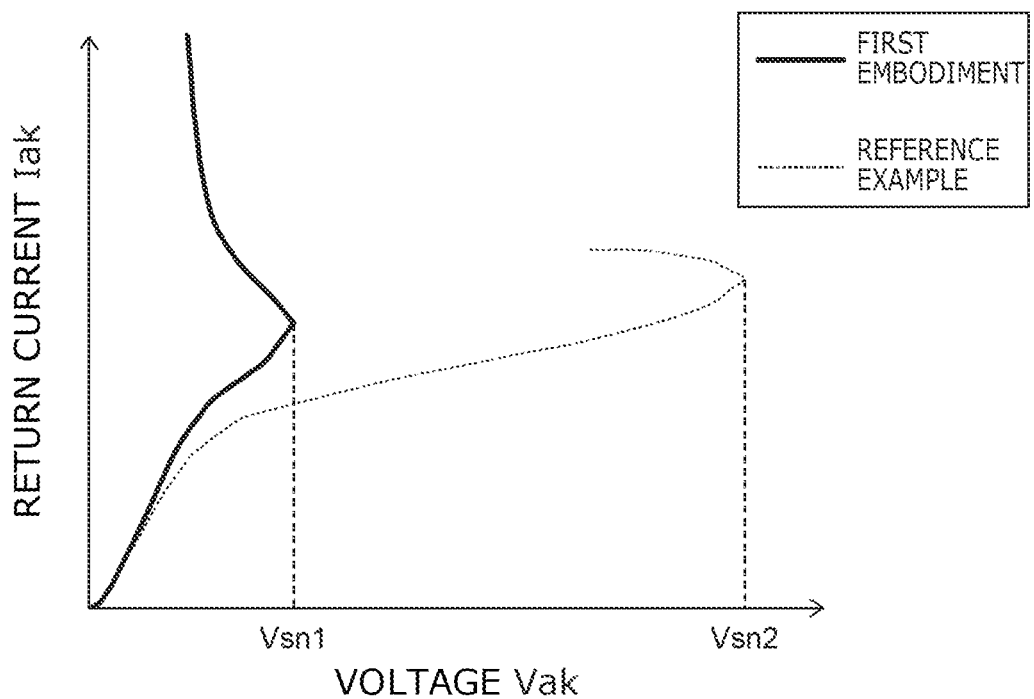
FIG. 4A is a graph showing simulation results of a relationship between a return current Iak and a voltage Vak applied between an upper electrode and a lower electrode in a diode region for the semiconductor device according to the first embodiment and the semiconductor device according to the reference example.
Figure 4B:
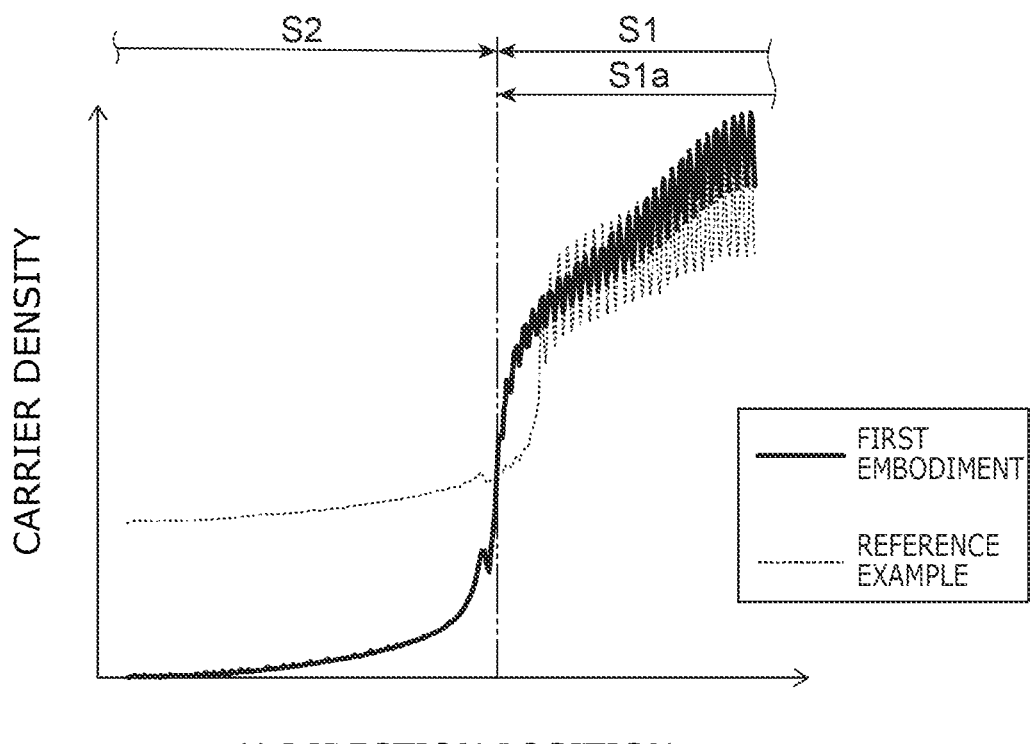
FIG. 4B is a graph showing simulation results of carrier densities of the semiconductor device according to the first embodiment and the semiconductor device according to the reference example.

FIG. 4A is a graph showing simulation results of a relationship between a return current Iak and a voltage Vak applied between the upper electrode and the lower electrode in the diode region for the semiconductor device according to the embodiment and the semiconductor device according to the reference example. FIG. 4B is a graph showing simulation results of the carrier densities of the semiconductor device according to the embodiment and the semiconductor device according to the reference example.

In FIGS. 3A and 3B, holes are shown by a figure of an "h" surrounded with a circle; and electrons are shown by a figure of an "e" surrounded with a circle. In FIG. 4A, the horizontal axis is the voltage yak, and the vertical axis is the return current Iak. In FIG. 4B, the horizontal axis is the X-direction position, and the vertical axis is the carrier density.

In the semiconductor device 100 according to the embodiment as shown in FIG. 3A, the n-type barrier layer 123c is not located in the first region S1a of the diode region S1. Conversely, in the semiconductor device 900 according to the reference example as shown in FIG. 3B, the n-type barrier layer 123c is located in an n-type semiconductor part 923 in the first region S1a of the diode region S1.

The return current Iak flows in the diode region S1 in the state in which the IGBT region S2 is off and the diode region S1 is on. In the semiconductor device 900 according to the reference example as shown in FIG. 4A, the return current Iak increases as the voltage Vak that is applied between the lower electrode 110 and the upper electrode 150 increases. Then, after the voltage Vak reaches a peak voltage Vsn2, the voltage Vak abruptly decreases as the return current Iak increases. This phenomenon is called "snapback".

Similarly, in the semiconductor device 100 according to the embodiment as well, the return current Iak increases as the voltage yak that is applied between the lower electrode 110 and the upper electrode 150 increases. Then, after the voltage Vak reaches a peak voltage Vsn1, the voltage yak decreases as the return current Iak increases. However, the peak voltage Vsn1 of the embodiment is less than the peak voltage Vsn2 of the reference example. Also, according to the embodiment, a greater return current Iak than that of the reference example can flow at a lower voltage Vak than that of the reference example. In other words, compared to the semiconductor device 900 according to the reference example, the snapback can be suppressed in the semiconductor device 100 according to the embodiment.

In the semiconductor device 900 according to the reference example as shown in FIG. 3B, the n-type barrier layer 123c is located in the first region S1a; therefore, the holes are not easily injected from the upper electrode 150 into the n$^-$-type drift layer 123b in the first region S1a; and the amount of holes ejected through the portion of the lower electrode 110 positioned in the first region S1a is low. Therefore, electrons are not easily injected from the lower electrode 110 into the n$^-$-type drift layer 123b in the first region S1a. Accordingly, the carrier density in the n$^-$-type drift layer 123b in the first region S1a is low. As a result, the conductivity modulation effect on the n$^-$-type drift layer 123b in the first region S1a, that is, the effect of reducing the electrical resistance of the n$^-$-type drift layer 123b in the first region S1a, is small. Thereby, the holes easily erode from the first region S1a to the IGBT region S2 side. Therefore, the amount of holes ejected through the portion of the lower electrode 110 positioned in the first region S1a is further reduced, and the injection amount of the electrons from the lower electrode 110 into the n$^-$-type drift layer 123b in the first region S1a is further reduced. Therefore, it is considered that the return current Iak does not easily flow when the voltage yak is applied between the lower electrode 110 and the upper electrode 150; and snapback occurs.

On the other hand, in the semiconductor device 100 according to the embodiment as shown in FIG. 3A, the n-type barrier layer 123c is not located in the first region S1a; therefore, the holes are easily injected from the upper electrode 150 into the n$^-$-type drift layer 123b in the first region S1a; and the amount of holes ejected through the portion of the lower electrode 110 positioned in the first region S1a is high. Therefore, the electrons are easily injected from the lower electrode 110 into the n$^-$-type drift layer 123b in the first region S1a. Accordingly, the carrier density in the n$^-$-type drift layer 123b in the first region S1a is high. As a result, the conductivity modulation effect on the n$^-$-type drift layer 123b in the first region S1a, that is, the effect of reducing the electrical resistance of the n$^-$-type drift layer 123b, is large. Thereby, the holes do not easily erode from the first region S1a to the IGBT region S2 side; and the holes are easily ejected through the portion of the lower electrode 110 positioned in the first region S1a. Therefore, the injection amount of the electrons from the lower electrode 110 into the n$^-$-type drift layer 123b in the first region S1a is further increased. It is considered that the return current Iak thereby flows easily when the voltage Vak is applied between the lower electrode 110 and the upper electrode 150; and the snapback can be suppressed.

Accordingly, as shown in FIG. 4B, the carrier density in the IGBT region S2 according to the embodiment is less than the carrier density in the IGBT region S2 in the reference example; and the carrier density in the first region S1a according to the embodiment is greater than the carrier density in the first region S1a in the reference example. As shown in FIG. 4A, it is considered that the peak voltage Vsn1 of the embodiment can be less than the peak voltage Vsn2 of the reference example; and a greater return current Iak than that of the reference example can be caused to flow at a lower voltage yak.

According to the embodiment, the n-type barrier layer 123c is located in the second region S1b of the diode region S1. Therefore, the holes are not easily injected from the upper electrode 150 into the n⁻-type drift layer 123b in the second region S1b in the state in which the diode region S1 is on. Therefore, the electrons are not easily injected from the lower electrode 110 into the n⁻-type drift layer 123b in the second region S1b. Accordingly, the carrier density in the n⁻-type drift layer 123b in the second region S1b is low. Therefore, the diode region S1 switches to the off-state, and the recovery loss can be reduced.

Thus, by promoting the injection of the carriers in the first region S1a adjacent to the IGBT region S2 and by suppressing the injection of the carriers in the second region S1b that is separated from the IGBT region S2, the semiconductor device 100 can be provided in which the recovery loss is small while snapback is suppressed.

According to the embodiment, the width L1 of the first region S1a is less than the width L2 of the second region S1b. Thus, by limiting the region that promotes the injection of the carriers to a region that is at the vicinity of the IGBT region S2, the recovery loss can be favorably reduced while suppressing snapback.

Second Embodiment

A second embodiment will now be described.

Figure 5:
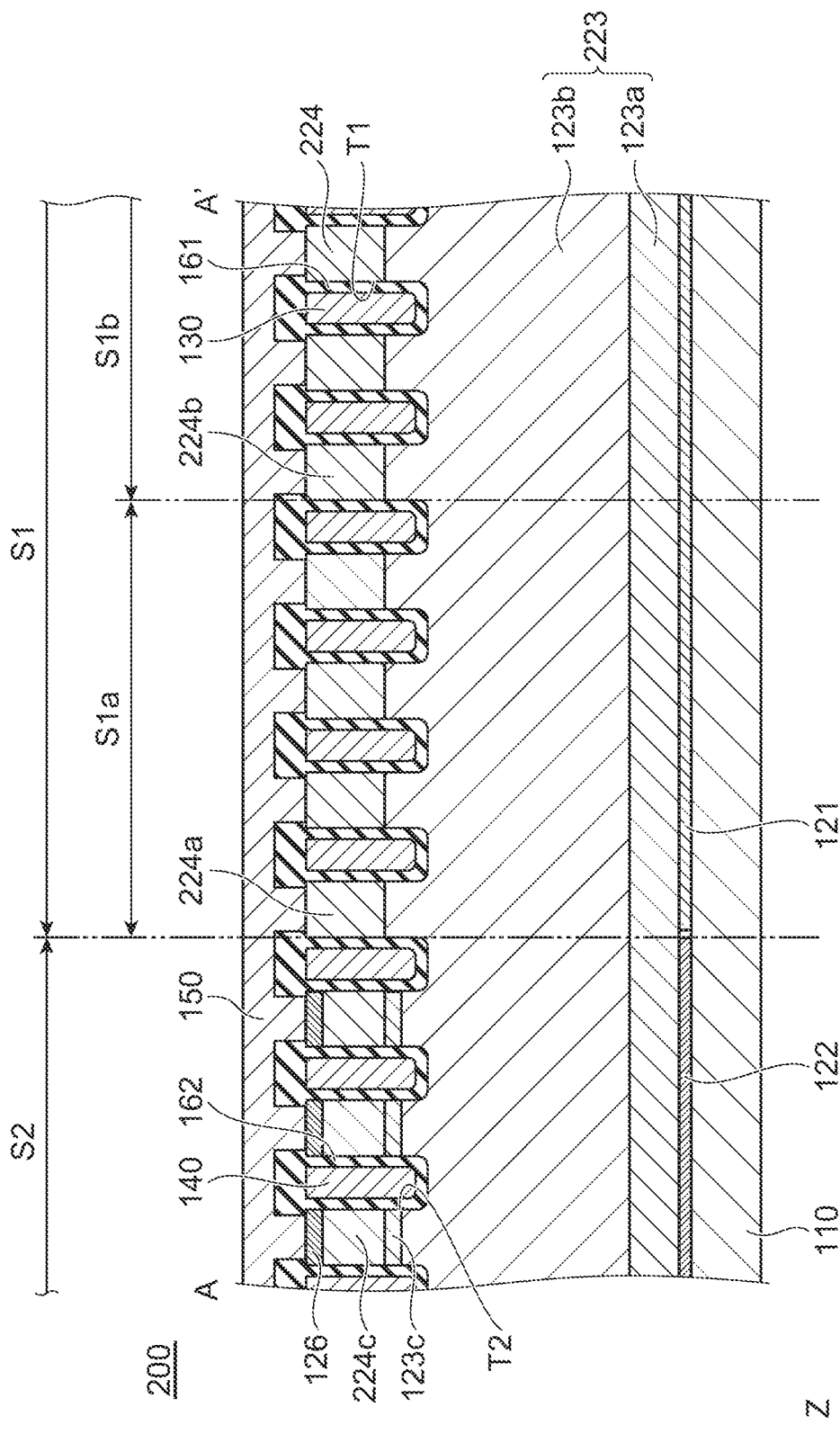
FIG. 5 is a cross-sectional view showing a semiconductor device according to a second embodiment.

FIG. 5 is a cross-sectional view showing a semiconductor device according to the embodiment.

The method of generating a difference of the carrier amounts injected into the n⁻-type drift layer 123b between the first region S1a and the second region S1b in the diode region S1 in the semiconductor device 200 according to the embodiment is different from that of the semiconductor device 100 according to the first embodiment.

As a general rule in the following description, only the differences with the first embodiment are described. Other than the items described below, the embodiment is similar to the first embodiment. This is similar for the other embodiments described below as well.

In a semiconductor part 223 of the semiconductor device 200, the n-type barrier layer 123c is not provided in the second region S1b. In other words, the impurity concentration of the portion of the upper layer portion of the semiconductor part 223 positioned in the first region S1a is substantially equal to the impurity concentration of the portion of the upper layer portion of the semiconductor part 223 positioned in the second region S1b.

In a p-type semiconductor layer 224 of the semiconductor device 200, the impurity concentration of a first portion 224a positioned in the first region S1a of the diode region S1 is greater than the impurity concentration of a second portion 224b positioned in the second region S1b. According to the embodiment, the impurity concentration of the first portion 224a is less than the impurity concentration of a third portion 224c of the p-type semiconductor layer 224 positioned in the IGBT region S2. However, the magnitude relationship between the impurity concentration of the first portion and the impurity concentration of the third portion is not limited to that described above. For example, the upper layer portion of the n-type semiconductor part may be configured so that the impurity concentration increases gradually or in stages from the boundary between the diode region and the IGBT region toward the center of the diode region. Also, for example, the p-type semiconductor layer may be configured so that the impurity concentration decreases gradually or in stages from the boundary between the diode region and the IGBT region toward the center of the diode region.

Effects of the embodiment will now be described.

Holes are easily injected from the upper electrode 150 into the n⁻-type drift layer 123b in the first region S1a because the impurity concentration of the first portion 224a is high. Therefore, snapback can be suppressed. On the other hand, because the impurity concentration of the second portion 224b is low, holes are not easily injected from the upper electrode 150 into the n⁻-type drift layer 123b in the second region S1b. Therefore, the recovery loss of the diode region S1 can be reduced.

Thus, by promoting the injection of the carriers in the first region S1a adjacent to the IGBT region S2 and by suppressing the injection of the carriers in the second region S1b that is separated from the IGBT region S2, the semiconductor device 200 can be provided in which the recovery loss is small while snapback is suppressed.

Third Embodiment

A third embodiment will now be described.

Figure 6:
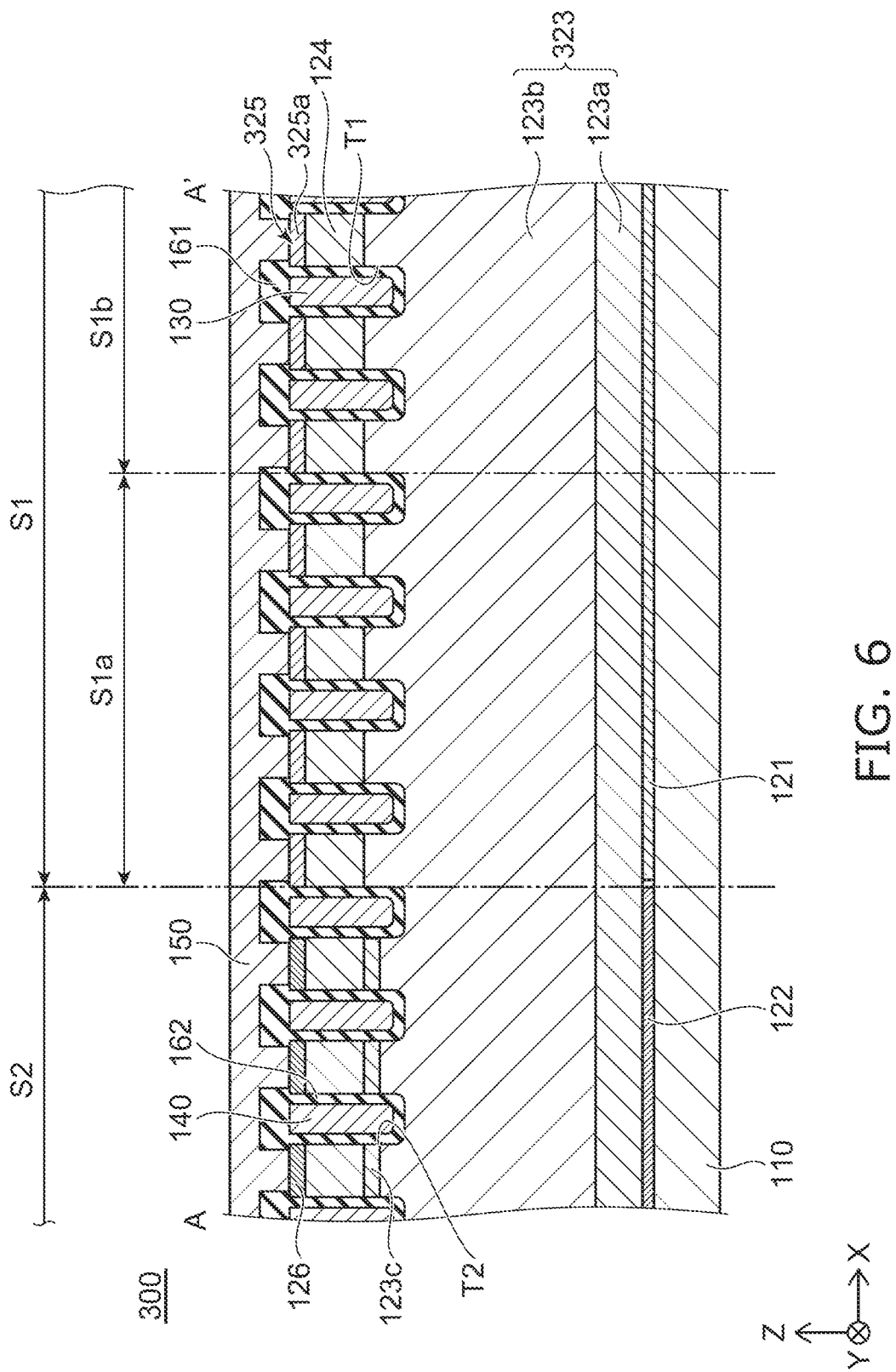
FIG. 6 is a cross-sectional view showing a semiconductor device according to a third embodiment.

FIG. 6 is a cross-sectional view showing a semiconductor device according to the embodiment.

Figure 7A:
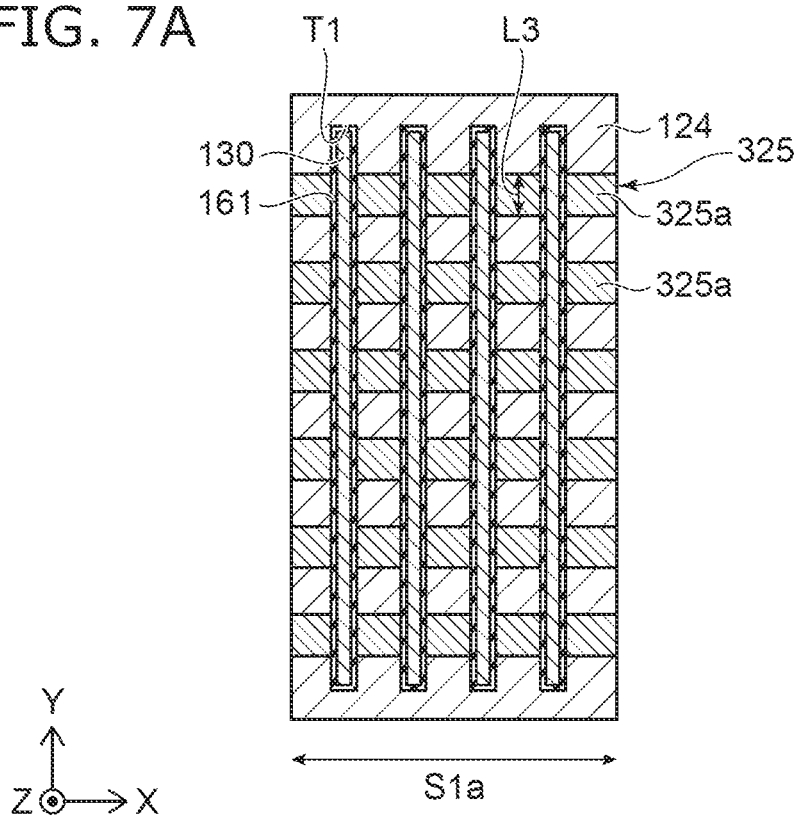
FIG. 7A is a cross-sectional view along upper surfaces of the p-type semiconductor layer and the pt-type contact layer in a first region of a diode region.
Figure 7B:
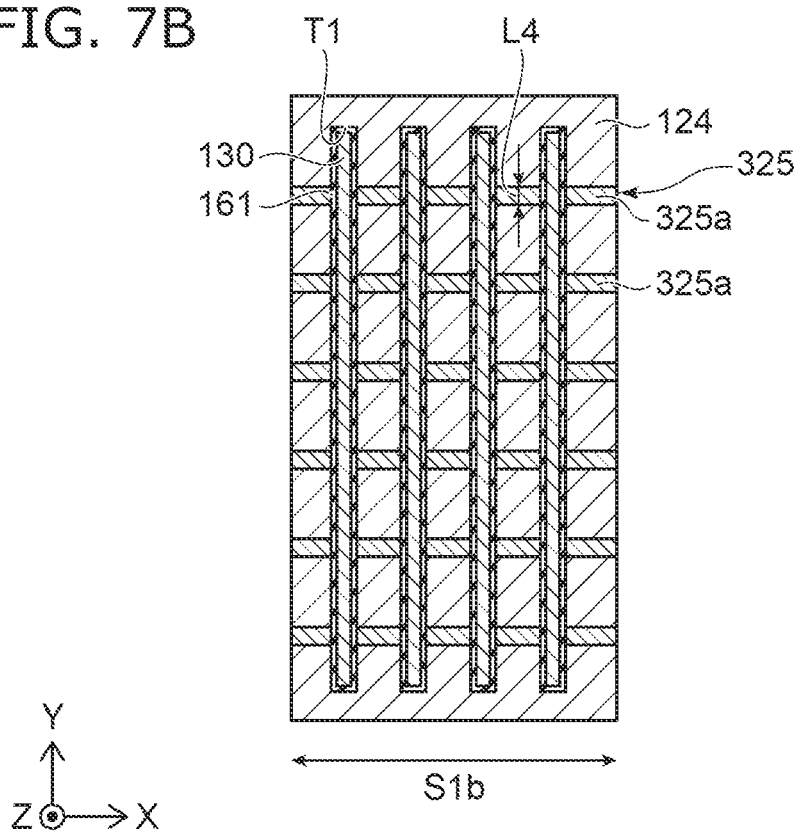
FIG. 7B is a cross-sectional view along the upper surfaces of the p-type semiconductor layer and the pt-type contact layer in the second region of the diode region.

FIG. 7A is a cross-sectional view along the upper surfaces of the p-type semiconductor layer and the p⁺-type contact layer in the first region of the diode region; and FIG. 7B is a cross-sectional view along the upper surfaces of the p-type semiconductor layer and the r-type contact layer in the second region of the diode region.

The method of generating the difference of the carrier amount injected into the n⁻-type drift layer 123b between the first region S1a and the second region S1b in the diode region S1 in the semiconductor device 300 according to the embodiment is different from that of the semiconductor device 100 according to the first embodiment.

As shown in FIG. 6, the n-type barrier layer 123c is not located in the second region S1b in a semiconductor part 323 of the semiconductor device 300. In other words, the impurity concentration of the portion of the upper layer portion of the semiconductor part 323 positioned in the first region S1a is substantially equal to the impurity concentration of the portion of the upper layer portion of the semiconductor part 323 positioned in the second region S1b.

The semiconductor device 300 includes a p⁺-type contact layer 325 that is located at the upper layer portion of the p-type semiconductor layer 124. As shown in FIGS. 7A and 7B, the p-type contact layer 325 includes multiple extension portions 325a. Each extension portion 325a extends in the X-direction. The multiple extension portions 325a are separated from each other and arranged in the Y-direction. In other words, the pattern of the arrangement of the p⁺-type contact layer is stripe-shaped. However, the configuration of the p⁺-type contact layer is not limited to that described above. For example, the extension portions may extend in a direction other than the X-direction such as the Y-direction, etc.; and the multiple extension portions may be arranged in a direction other than the Y-direction such as the X-direction, etc. Also, the pattern of the arrangement of the p⁺-type contact layer may not be stripe-shaped.

The impurity concentration of the p⁺-type contact layer 325 is greater than the impurity concentration of the p-type semiconductor layer 124. Although not particularly limited, the impurity concentration of the p-type semiconductor layer 124 is, for example, about 1×10¹⁷ cm⁻³. Although not particularly limited, the impurity concentration of the r-type contact layer 325 is, for example, about $1\times10^{18}$ cm$^{-3}$ to $1\times10^{19}$ cm$^{-3}$. The p-type semiconductor layer 124 and the upper electrode 150 have a Schottky contact. Conversely, the p$^+$-type contact layer 325 and the upper electrode 150 have an ohmic contact.

According to the embodiment, a width L3 in the Y-direction of each extension portion 325a located in the first region S1a is greater than a width L4 in the Y-direction of each extension portion 325a located in the second region S1b. Accordingly, when viewed from above, the surface area of the p$^+$-type contact layer 325 located per unit area in the first region S1a is greater than the surface area of the pt-type contact layer 325 located per unit area in the second region S1b.

Effects of the embodiment will now be described.

The surface area per unit area of the p$^+$-type contact layer 325 that has an ohmic contact with the upper electrode 150 in the first region S1a is greater than the surface area per unit area of the p$^+$-type contact layer 325 that has an ohmic contact with the upper electrode 150 in the second region S1b. Therefore, holes are easily injected from the upper electrode 150 into the n$^-$-type drift layer 123b in the first region S1a. Snapback can be suppressed thereby. On the other hand, holes are not easily injected from the upper electrode 150 into the n$^-$-type drift layer 123b in the second region S1b. The recovery loss of the diode region S1 can be reduced thereby.

Thus, by promoting the injection of the carriers in the first region S1a adjacent to the IGBT region S2 and by suppressing the injection of the carriers in the second region S1b that is separated from the IGBT region S2, the semiconductor device 300 can be provided in which the recovery loss is small while snapback is suppressed.

The method of setting the surface area per unit area of the p$^+$-type contact layer in the first region to be greater than the surface area per unit area of the p$^+$-type contact layer in the second region is not limited to that described above. For example, the surface area per unit area of the p$^+$-type contact layer in the first region may be set to be greater than the surface area per unit area of the p$^+$-type contact layer in the second region by setting the pitch of the multiple extension portions in the first region to be less than the pitch of the multiple extension portions in the second region.

While multiple embodiments are described above, the multiple embodiments can be combined with each other. For example, the p-type semiconductor layer 224 according to the second embodiment is applicable to the semiconductor device 100 according to the first embodiment and the semiconductor device 300 according to the third embodiment. Also, the p$^+$-type contact layer 325 according to the third embodiment is applicable to the semiconductor device 100 according to the first embodiment and the semiconductor device 200 according to the second embodiment.

Embodiments may include the following configurations (e.g., technological proposals).

Configuration 1

A semiconductor device in which a diode region and an IGBT region are set, the device comprising:

a first electrode located from the diode region to the IGBT region;

a first semiconductor layer located on the first electrode in the diode region, the first semiconductor layer being of a first conductivity type;

a second semiconductor layer located on the first electrode in the IGBT region, the second semiconductor layer being of a second conductivity type;

a semiconductor part located on the first and second semiconductor layers, the semiconductor part being of the first conductivity type, an impurity concentration in a first region of an upper layer portion of the semiconductor part being less than an impurity concentration in a second region of the upper layer portion, the first region being positioned in the diode region and being adjacent to the IGBT region, the second region being positioned in the diode region and separated from the IGBT region;

a third semiconductor layer located on the semiconductor part in the diode region and the IGBT region, the third semiconductor layer being of the second conductivity type;

a fourth semiconductor layer located in an upper layer portion of the third semiconductor layer in the IGBT region, the fourth semiconductor layer being of the first conductivity type;

a second electrode extending in a direction from the fourth semiconductor layer toward the semiconductor part in the IGBT region, the second electrode being next to the fourth semiconductor layer, the third semiconductor layer, and the semiconductor part;

a third electrode positioned on the third semiconductor layer in the diode region and positioned on the fourth semiconductor layer in the IGBT region; and an insulating film located between the second electrode and the fourth semiconductor layer, between the second electrode and the third semiconductor layer, between the second electrode and the semiconductor part, and between the second electrode and the third electrode.

Configuration 2

The device according to the configuration 1, wherein the semiconductor part includes:

a fifth semiconductor layer located from the diode region to the IGBT region, the fifth semiconductor layer including a lower impurity concentration than the first semiconductor layer, the fifth semiconductor layer contacting the third semiconductor layer in the first region of the diode region; and a sixth semiconductor layer located in an upper layer portion of the fifth semiconductor layer in the second region, the sixth semiconductor layer including a higher impurity concentration than the fifth semiconductor layer, the sixth semiconductor layer contacting the third semiconductor layer.

Configuration 3

A semiconductor device in which a diode region and an IGBT region are set, the device comprising:

a first electrode located from the diode region to the IGBT region;

a first semiconductor layer located on the first electrode in the diode region, the first semiconductor layer being of a first conductivity type;

a second semiconductor layer located on the first electrode in the IGBT region, the second semiconductor layer being of a second conductivity type;

a semiconductor part located on the first and second semiconductor layers, the semiconductor part being of the first conductivity type;

a third semiconductor layer located on the semiconductor part in the diode region and the IGBT region, the third semiconductor layer being of the second conductivity type, an impurity concentration of a first region of the third semiconductor layer being greater than an impurity concentration of a second region of the third semiconductor layer, the first region being positioned in the diode region and being adjacent to the IGBT region, the second region being positioned in the diode region and separated from the IGBT region;

a fourth semiconductor layer located in an upper layer portion of the third semiconductor layer in the IGBT region, the fourth semiconductor layer being of the first conductivity type;

a second electrode extending in a direction from the fourth semiconductor layer toward the semiconductor part in the IGBT region, the second electrode being next to the fourth semiconductor layer, the third semiconductor layer, and the semiconductor part;

a third electrode positioned on the third semiconductor layer in the diode region and positioned on the fourth semiconductor layer in the IGBT region; and an insulating film located between the second electrode and the fourth semiconductor layer, between the second electrode and the third semiconductor layer, between the second electrode and the semiconductor part, and between the second electrode and the third electrode.

Configuration 4

A semiconductor device in which a diode region and an IGBT region are set, the device comprising:

a first electrode located from the diode region to the IGBT region;

a first semiconductor layer located on the first electrode in the diode region, the first semiconductor layer being of a first conductivity type;

a second semiconductor layer located on the first electrode in the IGBT region, the second semiconductor layer being of a second conductivity type;

a semiconductor part located on the first and second semiconductor layers, the semiconductor part being of the first conductivity type;

a third semiconductor layer located on the semiconductor part in the diode region and the IGBT region, the third semiconductor layer being of the second conductivity type;

a fourth semiconductor layer located in an upper layer portion of the third semiconductor layer in the IGBT region, the fourth semiconductor layer being of the first conductivity type;

a fifth semiconductor layer located in the upper layer portion of the third semiconductor layer in the diode region, the fifth semiconductor layer being of the second conductivity type, the fifth semiconductor layer including a higher impurity concentration than the third semiconductor layer, a surface area per unit area of the fifth semiconductor layer in a first region being greater than a surface area per unit area of the fifth semiconductor layer in a second region, the first region being positioned in the diode region when viewed from above and being adjacent to the IGBT region, the second region being positioned in the diode region when viewed from above and being separated from the IGBT region;

a second electrode extending in a direction from the fourth semiconductor layer toward the semiconductor part in the IGBT region, the second electrode being next to the fourth semiconductor layer, the third semiconductor layer, and the semiconductor part;

a third electrode positioned on the third semiconductor layer in the diode region and positioned on the fourth semiconductor layer in the IGBT region; and an insulating film located between the second electrode and the fourth semiconductor layer, between the second electrode and the third semiconductor layer, between the second electrode and the semiconductor part, and between the second electrode and the third electrode.

Configuration 5

The device according to the configurations 4, wherein the fifth semiconductor layer includes a plurality of extension portions, the plurality of extension portions extends in a first direction and is arranged in a second direction crossing the first direction when viewed from above, and a width in the second direction of the extension portion positioned in the first region is greater than a width in the second direction of the extension portion positioned in the second region.

Configuration 6

The device according to any one of the configurations 1-5, wherein a width of the first region in a direction from the diode region toward the IGBT region is less than a width of the second region in the direction from the diode region toward the IGBT region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device in which a diode region and an IGBT region are set,
   the device comprising:
   a first electrode located from the diode region to the IGBT region;
   a first semiconductor layer located on the first electrode in the diode region, the first semiconductor layer being of a first conductivity type;
   a second semiconductor layer located on the first electrode in the IGBT region, the second semiconductor layer being of a second conductivity type;
   a semiconductor layer located on the first and second semiconductor layers, the semiconductor layer being of the first conductivity type, an impurity concentration in a first upper region of the semiconductor layer in a first region being less than an impurity concentration in a second upper region of the semiconductor layer in a second region, the first region being positioned in the diode region and being adjacent to the IGBT region, the second region being positioned in the diode region and separated from the IGBT region;
   a third semiconductor layer located on the semiconductor layer in the diode region and the IGBT region, the third semiconductor layer being of the second conductivity type;
   a fourth semiconductor layer located on the third semiconductor layer in the IGBT region, the fourth semiconductor layer being of the first conductivity type;
   a second electrode extending in a direction from the fourth semiconductor layer toward the semiconductor layer in the IGBT region, the second electrode being next to the fourth semiconductor layer, the third semiconductor layer, and the semiconductor layer;

a third electrode positioned on the third semiconductor layer in the diode region and positioned on the fourth semiconductor layer in the IGBT region; and an insulating film located between the second electrode and the fourth semiconductor layer, between the second electrode and the third semiconductor layer, between the second electrode and the semiconductor layer, and between the second electrode and the third electrode.

2. The device according to claim 1, wherein the semiconductor layer includes:

a fifth semiconductor layer located from the diode region to the IGBT region, the fifth semiconductor layer including a lower impurity concentration than the first semiconductor layer, the fifth semiconductor layer contacting the third semiconductor layer in the first region of the diode region; and a sixth semiconductor layer located in a first upper region of the fifth semiconductor layer in the second region, the sixth semiconductor layer including a higher impurity concentration than the fifth semiconductor layer, the sixth semiconductor layer contacting the third semiconductor layer.

3. A semiconductor device in which a diode region and an IGBT region are set, the device comprising:

a first electrode located from the diode region to the IGBT region;

a first semiconductor layer located on the first electrode in the diode region, the first semiconductor layer being of a first conductivity type;

a second semiconductor layer located on the first electrode in the IGBT region, the second semiconductor layer being of a second conductivity type;

a semiconductor layer located on the first and second semiconductor layers, the semiconductor layer being of the first conductivity type;

a third semiconductor layer located on the semiconductor layer in the diode region and the IGBT region, the third semiconductor layer being of the second conductivity type, an impurity concentration of a first region of the third semiconductor layer being greater than an impurity concentration of a second region of the third semiconductor layer, the first region being positioned in the diode region and being adjacent to the IGBT region, the second region being positioned in the diode region and separated from the IGBT region;

a fourth semiconductor layer on the third semiconductor layer in the IGBT region, the fourth semiconductor layer being of the first conductivity type;

a second electrode extending in a direction from the fourth semiconductor layer toward the semiconductor layer in the IGBT region, the second electrode being next to the fourth semiconductor layer, the third semiconductor layer, and the semiconductor layer;

a third electrode positioned on the third semiconductor layer in the diode region and positioned on the fourth semiconductor layer in the IGBT region; and an insulating film located between the second electrode and the fourth semiconductor layer, between the second electrode and the third semiconductor layer, between the second electrode and the semiconductor layer, and between the second electrode and the third electrode.

4. A semiconductor device in which a diode region and an IGBT region are set, the device comprising:

a first electrode located from the diode region to the IGBT region;

a first semiconductor layer located on the first electrode in the diode region, the first semiconductor layer being of a first conductivity type;

a second semiconductor layer located on the first electrode in the IGBT region, the second semiconductor layer being of a second conductivity type;

a semiconductor layer located on the first and second semiconductor layers, the semiconductor layer being of the first conductivity type;

a third semiconductor layer located on the semiconductor layer in the diode region and the IGBT region, the third semiconductor layer being of the second conductivity type;

a fourth semiconductor layer on the third semiconductor layer in the IGBT region, the fourth semiconductor layer being of the first conductivity type;

a fifth semiconductor layer on the third semiconductor layer in the diode region, the fifth semiconductor layer being of the second conductivity type, the fifth semiconductor layer including a higher impurity concentration than the third semiconductor layer, a surface area per unit area of the fifth semiconductor layer in a first region being greater than a surface area per unit area of the fifth semiconductor layer in a second region, the first region being positioned in the diode region when viewed from above and being adjacent to the IGBT region, the second region being positioned in the diode region when viewed from above and being separated from the IGBT region;

a second electrode extending in a direction from the fourth semiconductor layer toward the semiconductor layer in the IGBT region, the second electrode being next to the fourth semiconductor layer, the third semiconductor layer, and the semiconductor layer;

a third electrode positioned on the third semiconductor layer in the diode region and positioned on the fourth semiconductor layer in the IGBT region; and an insulating film located between the second electrode and the fourth semiconductor layer, between the second electrode and the third semiconductor layer, between the second electrode and the semiconductor layer, and between the second electrode and the third electrode.

5. The device according to claim 4, wherein the fifth semiconductor layer includes a plurality of extension portions, the plurality of extension portions extends in a first direction and is arranged in a second direction crossing the first direction when viewed from above, and a width in the second direction of the extension portion positioned in the first region is greater than a width in the second direction of the extension portion positioned in the second region.

6. The device according to claim 1, wherein a width of the first region in a direction from the diode region toward the IGBT region is less than a width of the second region in the direction from the diode region toward the IGBT region.

7. The device according to claim 3, wherein
a width of the first region in a direction from the diode region toward the IGBT region is less than a width of the second region in the direction from the diode region toward the IGBT region.

8. The device according to claim 4 wherein
a width of the first region in a direction from the diode region toward the IGBT region is less than a width of the second region in the direction from the diode region toward the IGBT region.

9. The device according to claim 1, wherein
the first upper region and the second upper region are in direct contact with the third semiconductor layer.

* * * * *